(12) United States Patent
Yim et al.

(10) Patent No.: US 12,052,885 B2
(45) Date of Patent: Jul. 30, 2024

(54) ORGANIC LIGHT-EMITTING DIODE DISPLAY DEVICE

(71) Applicant: SAMSUNG DISPLAY CO., LTD., Yongin-si (KR)

(72) Inventors: Sanghoon Yim, Suwon-si (KR); Wonjong Kim, Suwon-si (KR); Yisu Kim, Seoul (KR); Minho Oh, Suwon-si (KR); Wonmin Yun, Suwon-si (KR); Kwanhee Lee, Suwon-si (KR); Byoungduk Lee, Seongnam-si (KR); Yoonhyeung Cho, Yongin-si (KR); Youngcheol Joo, Hwaseong-si (KR); Yongchan Ju, Gwangmyeong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/212,003

(22) Filed: Mar. 25, 2021

(65) Prior Publication Data

US 2021/0210733 A1 Jul. 8, 2021

Related U.S. Application Data

(63) Continuation of application No. 15/482,169, filed on Apr. 7, 2017, now abandoned.

(30) Foreign Application Priority Data

Jul. 6, 2016 (KR) .................. 10-2016-0085470

(51) Int. Cl.
*H10K 50/858* (2023.01)
*H10K 50/844* (2023.01)
(Continued)

(52) U.S. Cl.
CPC ....... *H10K 50/858* (2023.02); *H10K 50/8445* (2023.02); *H10K 59/12* (2023.02);
(Continued)

(58) Field of Classification Search
CPC ............. H01L 51/5275; H01L 27/3244; H01L 51/5256; H01L 51/56; H01L 2227/323;
(Continued)

(56) References Cited

U.S. PATENT DOCUMENTS 9,431,634 B2 8/2016 Song
9,773,994 B2 * 9/2017 Kim ..................... H10K 50/828
(Continued)

FOREIGN PATENT DOCUMENTS

CN 103874577 6/2014
CN 105633118 6/2016
(Continued)

OTHER PUBLICATIONS

Chinese Office Action issued in corresponding Chinese Patent Application No. 201710545336.X on Nov. 30, 2021.
(Continued)

*Primary Examiner* — Benjamin Tzu-Hung Liu
(74) *Attorney, Agent, or Firm* — F. Chau & Associates, LLC

(57) ABSTRACT

An display device including a substrate, an organic light-emitting diode, and a thin film encapsulation layer. The organic light-emitting diode is disposed on the substrate. The thin film encapsulation layer is disposed on the organic light-emitting diode. The thin film encapsulation layer includes at least one inorganic layer, at least one organic layer, and a first refractive-index control layer. The at least one organic layer is alternately disposed with the at least one inorganic layer. The first refractive-index layer is disposed between one of the at least one inorganic layer and one of the
(Continued)

at least one organic layer disposed adjacent to each other. The first refractive-index control layer has a refractive-index variation ratio per unit length (Δn/nm) from about 0.001/nm to about 0.002/nm along a direction from the organic light-emitting diode toward the thin film encapsulation layer.

15 Claims, 9 Drawing Sheets

(51) Int. Cl.
  *H10K 59/12* (2023.01)
  *H10K 71/00* (2023.01)
  *H10K 102/00* (2023.01)
(52) U.S. Cl.
  CPC ......... *H10K 71/00* (2023.02); *H10K 59/1201* (2023.02); *H10K 2102/351* (2023.02)
(58) Field of Classification Search
  CPC ............ H01L 2251/558; H10K 50/858; H10K 50/8445; H10K 59/12; H10K 71/00; H10K 59/1201; H10K 2102/351
  See application file for complete search history.

(56) References Cited

U.S. PATENT DOCUMENTS

| | | | |
|---|---|---|---|
| 2011/0223434 A1 | 9/2011 | Roehrig et al. | |
| 2014/0034919 A1* | 2/2014 | Park | H10K 50/858 257/40 |
| 2014/0138636 A1 | 5/2014 | Song | |
| 2014/0166105 A1* | 6/2014 | Kawakami | H01L 31/049 257/40 |
| 2014/0166613 A1* | 6/2014 | Doll | C03C 17/00 216/13 |
| 2014/0306193 A1 | 10/2014 | Lee et al. | |
| 2015/0123086 A1* | 5/2015 | Lee | H10K 50/858 438/26 |
| 2015/0137131 A1* | 5/2015 | Kim | H10K 50/8445 438/28 |
| 2015/0261370 A1* | 9/2015 | Yoo | G06F 3/0412 345/173 |
| 2016/0079567 A1 | 3/2016 | Cho et al. | |
| 2016/0093828 A1 | 3/2016 | Kim et al. | |
| 2016/0126498 A1 | 5/2016 | Kim | |
| 2016/0190519 A1 | 6/2016 | Cho et al. | |
| 2017/0334166 A1 | 11/2017 | Kawakami et al. | |
| 2018/0013100 A1 | 1/2018 | Yim et al. | |
| 2019/0041718 A1* | 2/2019 | Yamada | G02F 1/1347 |

FOREIGN PATENT DOCUMENTS

| | | |
|---|---|---|
| JP | 2012-004116 | 1/2012 |
| JP | 2013-067109 | 4/2013 |
| KR | 10-2014-0064349 | 5/2014 |
| KR | 10-2015-0012125 | 2/2015 |
| KR | 10-2015-0052490 | 5/2015 |
| KR | 10-2016-0031108 | 3/2016 |
| KR | 10-2016-0036722 | 4/2016 |

OTHER PUBLICATIONS

Chinese Office Action dated Sep. 25, 2020 issued in corresponding Chinese Patent Application No. 201710545336.X.
Office Action dated Jun. 28, 2023 issued in corresponding Korean Patent Application No. 10-2016-0085470, including English translation.
Office Action dated Dec. 12, 2022 issued in corresponding Korean Patent Application No. 10-2016-0085470.

* cited by examiner

ORGANIC LIGHT-EMITTING DIODE DISPLAY DEVICE

CROSS-REFERENCE TO RELATED APPLICATIONS

This application is a continuation of U.S. patent application Ser. No. 15/482,169 filed on Apr. 7, 2017, which claims priority under 35 U.S.C. § 119 to Korean Patent Application No. 10-2016-0085470, filed on Jul. 6, 2016 in the Korean Intellectual Property Office, the disclosures of which are incorporated by reference herein in their entireties.

TECHNICAL FIELD

Exemplary embodiments of the present invention relate to a display device, and more particularly, to an organic light-emitting diode ("OLED") display device.

DISCUSSION OF RELATED ART

Organic light-emitting diode ("OLED") display devices are a self-emission type display device. OLED display devices display an image using an OLED that emits light. The OLED display devices may have characteristics of relatively low power consumption, relatively high luminance, and relatively high response speed.

The OLED display device may have a multi-layered structure. The multi-layered structure includes an OLED. In the OLED including the multi-layered structure, light may be generated in the OLED is dissipated in a process of being emitted outwards. Thus, the OLED display device may have a relatively low light emission efficiency.

SUMMARY

Exemplary embodiments of the present invention may be directed to an organic light emitting diode ("OLED") display device having a relatively low light emission deviation and relatively high light-emitting characteristics.

One or more exemplary embodiments of the present invention provide a display device including a substrate, an organic light-emitting diode, and a thin film encapsulation layer. The organic light-emitting diode is disposed on the substrate. The thin film encapsulation layer is disposed on the organic light-emitting diode. The thin film encapsulation layer includes at least one inorganic layer, at least one organic layer, and a first refractive-index control layer. The at least one organic layer is alternately disposed with the at least one inorganic layer. The first refractive-index control layer is disposed between one of the at least one inorganic layer and one of the at least one organic layer disposed adjacent to each other. The first refractive-index control layer has a refractive-index variation ratio per unit length ($\Delta n/nm$) from about 0.001/nm to about 0.002/nm along a direction from the organic light-emitting diode toward the thin film encapsulation layer.

The first refractive-index control layer may have a refractive index from about 1.5 to about 1.8.

The first refractive-index control layer may have a refractive index decreasing in a gradual manner along a direction from the at least one inorganic layer toward the at least one organic layer.

The first refractive-index control layer may include a first surface and a second surface. The first surface may face the inorganic layer. The second surface may face the organic layer. The first surface may have a higher refractive index than a refractive index of the second surface by about 0.1 to about 0.3.

The first refractive-index control layer may have a thickness of from about 100 nm to about 250 nm.

The first refractive-index control layer may include at least one relatively low refractive-index material and at least one high refractive-index material. The at least one low refractive-index material may include silicon oxide, magnesium fluoride, acrylic polymer, polyimide, polyamide, or $Alq_3$[Tris(8-hydroxyquinolinato)aluminium]. The relatively high refractive-index material may include zinc oxide, titanium oxide, zirconium oxide, niobium oxide, tantalum oxide, tin oxide, nickel oxide, silicon nitride, indium nitride, gallium nitride, poly(3,4-ethylenedioxythiophene) (PEDOT), 4,4'-bis[N-(3-methylphenyl)-N-phenylamino]biphenyl (TPD), 4,4',4"-tris[(3-methylphenyl)phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino]benzene (m-MTDAB), 1,3,5-tris [N,N-bis (4-methylphenyl)amino]benzene (p-MTDAB), 4,4'-bis[N,N-bis(3-methylphenyl)-amino]diphenylmethane (BPPM), 4,4-dicarbazolyl-1,1'-biphenyl (CBP), 4,4',4"-tris (N-carbazole) triphenylamine (TCTA), 2,2',2"-(1,3,5-benzenetolyl)tris-[1-phenyl-1H-benzoimidazol] (TPBI), or 3-(4-biphenyl)-4-phenyl-5-t-butylphenyl-1,2,4-triazole (TAZ).

The first refractive-index control layer may include a first matching layer and a second matching layer. The first matching layer may be disposed on the inorganic layer. The second matching layer may be disposed on the first matching layer.

The first matching layer and the second matching layer may have a refractive-index difference from about 0.05 to about 0.1.

The first matching layer may have a higher refractive index than a refractive index of the second matching layer by about 0.05 to about 0.1.

The display device may include a third matching layer. The third matching layer may be disposed on the second matching layer. The third matching layer may have a lower refractive index than a refractive index of the second matching layer.

Each of the first matching layer and the second matching layer may have a thickness of from about 25 nm to about 60 nm.

The at least one inorganic layer may have a refractive index from about 1.6 to about 2.8.

The at least one inorganic layer may have a thickness of from about 100 nm to about 1,000 nm.

The at least one organic layer may have a refractive index from about 1.4 to about 1.6.

The at least one organic layer may have a thickness of from about 100 nm to about 8,000 nm.

The display device may further include a capping layer. The capping layer may be disposed between the organic light-emitting diode and the thin film encapsulation layer.

The thin film encapsulation layer may include a second refractive-index control layer. The second refractive-index control layer may be disposed opposite the first refractive-index control layer with respect to the at least one inorganic layer.

The thin film encapsulation layer may include a third refractive-index control layer. The third refractive-index control layer may be disposed opposite the first refractive-index control layer with respect to the at least one organic layer.

The organic light-emitting diode may include a first electrode, an organic light-emitting layer, and a second electrode. The first electrode may be disposed on the substrate. The organic light-emitting layer may be disposed on the first electrode. The second electrode may be disposed on the organic light-emitting layer.

One or more exemplary embodiments of the present invention provide a display device. The display device includes a substrate, an organic light-emitting diode, and a thin film encapsulation layer. The organic light-emitting diode is disposed on the substrate. The thin film encapsulation layer is disposed on the organic light-emitting diode. The thin film encapsulation layer includes at least one inorganic layer and at least one organic layer. The at least one organic layer is disposed alternately with the at least one inorganic layer. The at least one inorganic layer has a refractive index from about 1.75 to about 2.55. One of the at least one inorganic layer and one of the at least one organic layer have a refractive-index difference of about 0.15 or less.

The inorganic layer and the at least one organic layer may have a refractive-index difference of about 0.06 or less.

The at least one organic layer may include poly(3,4-ethylenedioxythiophene)(PEDOT), 4,4'-bis[N-(3-methylphenyl)-N-phenylamino]biphenyl (TPD), 4,4',4"-tris[(3-methylphenyl)phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino] benzene (m-MTDAB), 1,3,5-tris [N,N-bis (4-methylphenyl) amino]benzene (p-MTDAB), 4,4'-bis[N,N-bis(3-methylphenyl)-amino]diphenylmethane (BPPM), 4,4-dicarbazolyl-1,1'-biphenyl (CBP), 4,4',4"-tris(N-carbazole) triphenylamine (TCTA), 2,2',2"-(1,3,5-benzenetolyl)tris-[1-phenyl-1H-benzoimidazol] (TPBI), or 3-(4-biphenyl)-4-phenyl-5-t-butylphenyl-1,2,4-triazole (TAZ).

The thin film encapsulation layer may have a thickness of about 50 μm or less.

The at least one inorganic layer may have a thickness of from about 100 nm to about 1,000 nm.

The at least one inorganic layer includes silver, metal oxide, metal oxynitride, silicon oxide, silicon nitride, silicon oxynitride, or any combination thereof.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
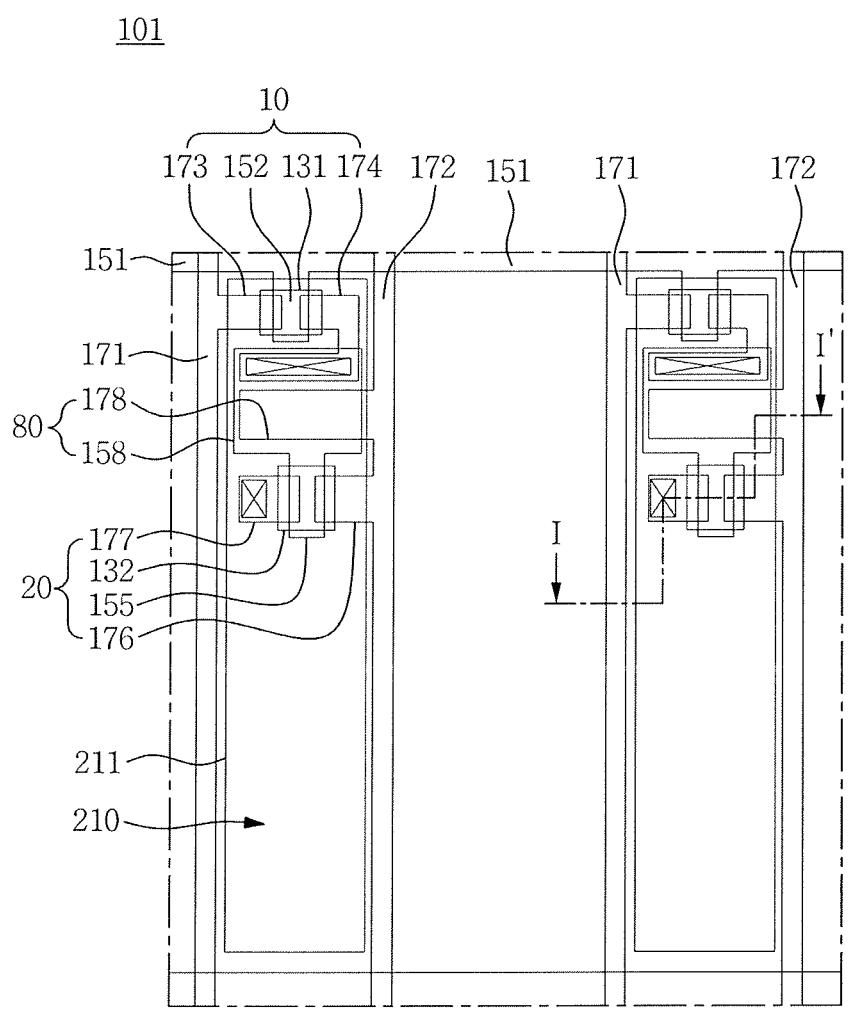
FIG. 1 is a plan view illustrating an organic light-emitting diode ("OLED") display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

It will be understood that although the terms "first" and "second" may be used herein to describe various components, these components should not be limited by these terms.

Sizes of elements in the drawings may be exaggerated for clarity of description.

It will be understood that when a component, such as a layer, a film, a region, or plate, is referred to as being "on" another component, the component may be directly on the other component or intervening components may be present.

Figure 2:
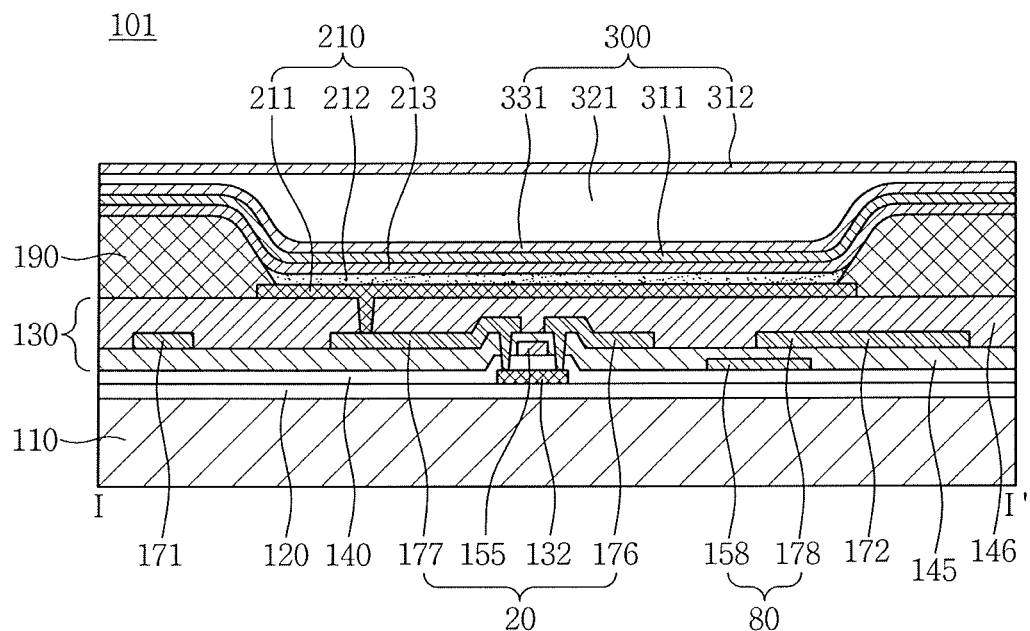
FIG. 2 is a cross-sectional view taken along a line I-I' of FIG. 1 illustrating an OLED display device according to an exemplary embodiment of the present invention.

FIG. 1 is a plan view illustrating an organic light-emitting diode ("OLED") display device according to an exemplary embodiment of the present invention. FIG. 2 is a cross-sectional view taken along a line I-I' of FIG. 1 illustrating an OLED display device according to an exemplary embodiment of the present invention.

Referring to FIGS. 1 and 2, an OLED display device 101 may include a substrate 110, a wiring unit 130, an OLED 210, and a thin film encapsulation layer 300.

The substrate 110 may include an insulating material. The insulating material may include glass, quartz, ceramic, or plastic. However, exemplary embodiments of the present invention are not limited thereto. For example, the substrate 110 may include a metal material such as stainless steel.

The OLED display device 101 may include a buffer layer 120. The buffer layer 120 may be disposed on the substrate 110. The buffer layer 120 may have a single-layered structure. Alternatively, the buffer layer 120 may have a multi-layered structure. The buffer layer 120 may include at least one layer of various inorganic layers or organic layers. The buffer layer 120 may be configured to prevent or reduce an infiltration of impurities, such as foreign elements or moisture, into the wiring unit 130 or the OLED 210. The buffer layer 120 may also planarize a surface of the substrate 110.

However, exemplary embodiments of the present invention are not limited thereto and the buffer layer 120 may be omitted.

The wiring unit 130 may be disposed on the buffer layer 120. The wiring unit 130 may have a structure including a switching thin film transistor ("TFT") 10, a driving TFT 20, and a capacitor 80. The wiring unit 120 may drive the OLED 210. The OLED 210 may emit light. The OLED 210 may emit light based on a driving signal. The driving signal may be applied from the wiring unit 130. Thus, an image may be displayed.

FIGS. 1 and 2 illustrate an active matrix-type organic light-emitting diode (AMOLED) display device 101. The AMOLED display device 101 may have a 2Tr-1Cap structure. The 2Tr-1Cap structure may include two TFTs, for example, the switching TFT 10 and the driving TFT 20 disposed in each of a plurality of pixels. The 2Tr-1Cap structure may include at least one capacitor 80 disposed in each pixel. However, exemplary embodiments of the present invention are not limited thereto. For example, the OLED display device 101 may include at least three TFTs and at least two capacitors disposed in each pixel. The OLED display device 101 may include additional wirings. The term "pixel", as used herein, may refer to a unit for displaying an image. The OLED display device 101 may display an image using a plurality of pixels.

Each pixel may include the switching TFT 10, the driving TFT 20, the capacitor 80, and the OLED 210. A gate line 151 may be disposed along one direction. A data line 171 may be disposed on the wiring unit 30. A common power line 172 may be disposed on the wiring unit 130. The common power line 172 may be insulated from the gate line 151. The common power line 172 may intersect the gate line 151. Each pixel may be defined by the gate line 151, the data line 171, and the common power line 172. Accordingly, the gate line 151, the data line 171, and the common power line 172 may each serve as a boundary. However, exemplary embodiments of the present invention are not limited thereto. For example, each pixel may be defined by a pixel defining layer 190.

The capacitor 80 may include a first capacitor plate 158 and a second capacitor plate 178. The OLED display device 101 may also include an insulating interlayer 145. The insulating interlayer 145 may be disposed between the first capacitor plate 158 and the second capacitor plate 178. The insulating interlayer 145 may be a dielectric body. A capacitance of the capacitor 80 may be determined by electric charges accumulated in the capacitor 80 and a voltage across the first capacitor plate 158 and the second capacitor plate 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177. The OLED display device 101 may include a gate insulating layer 140. The gate insulating layer 140 may insulate the switching semiconductor layer 131 and the driving semiconductor layer 132. The gate insulating layer 140 may insulate the switching gate electrode 152 and the driving gate electrode 155. The gate insulating layer 140 may insulate the switching semiconductor layer 131 from the switching gate electrode 152. The gate insulating layer 140 may insulate the driving semiconductor layer 132 from the driving gate electrode 155.

The switching TFT 10 may function as a switching element. The switching element may select a pixel to perform light emission. The switching gate electrode 152 may be connected to the gate line 151. The switching source electrode 173 may be connected to the data line 171. The switching drain electrode 174 may be spaced apart from the switching source electrode 173. The switching drain electrode 174 may be connected to the first capacitor plate 158 or the second capacitor plate 178. For example, the switching drain electrode 174 may be connected to the first capacitor plate 158.

The driving TFT 20 may apply a driving power. The driving power may allow an organic light-emitting layer 212 of the OLED 210 in a selected pixel to emit light. The organic light-emitting layer 212 of the OLED 210 in a selected pixel may emit light to a first electrode 211. The driving gate electrode 155 may be connected to the first capacitor plate 158. The first capacitor plate 158 may be connected to the switching drain electrode 174. The driving source electrode 176 may be connected to the common power line 172. The second capacitor plate 178 may be connected to the common power line 172. The driving drain electrode 177 may be connected to the first electrode 211 of the OLED 210. The driving drain electrode 177 may be connected to the first electrode 211 through a contact hole. The first electrode 211 may be a pixel electrode.

The switching TFT 10 may be operated based on a gate voltage. The gate voltage may be applied to the gate line 151. The switching TFT 10 may transmit a data voltage applied to the data line 171 to the driving TFT 20. A voltage substantially equivalent to a difference between a common voltage applied to the driving TFT 20 from the common power line 172 and the data voltage transmitted by or from the switching TFT 10 may be stored in the capacitor 80. A current corresponding to the voltage stored in the capacitor 80 may flow to the OLED 210. The current corresponding to the voltage stored in the capacitor 80 may flow to the OLED 210 through the driving TFT 20. Thus, the OLED 210 may emit light.

A planarization layer 146 may be disposed on the insulating interlayer 145. The planarization layer 146 may include an insulating material. The planarization layer 146 may protect the wiring unit 130. The planarization layer 146 and the insulating interlayer 145 may include substantially a same material.

The OLED 210 may be disposed on the planarization layer 146. The OLED 210 may include the first electrode 211, the organic light-emitting layer 212, and a second electrode 213. The organic light-emitting layer 212 may be disposed on the first electrode 211. The second electrode 213 may be disposed on the organic light-emitting layer 212. Holes and electrons may be respectively supplied from the first electrode 211 and the second electrode 213 into the organic light-emitting layer 212. The holes and electrons may combine with each other in the light-emitting layer 212. The holes and electrons combined in the light-emitting layer 212 may form excitons. When the excitons fall from an excited state to a ground state, energy may be released. The OLED 210 may emit light by the energy generated when the excitons fall from the excited state to the ground state.

According to an exemplary embodiment of the present invention, the first electrode 211 may serve as an anode. Thus, the first electrode 211 may inject holes. The second electrode 213 may serve as a cathode. Thus, the second electrode 213 may inject electrons. However, exemplary embodiments of the present invention are not limited thereto. For example, the first electrode 211 may serve as a cathode. The second electrode 213 may serve as an anode.

According to an exemplary embodiment of the present invention, the first electrode 211 may include a reflective layer. The second electrode 213 may include a transflective layer. Accordingly, light generated in the organic light-emitting layer 212 may pass through the second electrode 213. Light passing through the second electrode 213 may be emitted. Thus, the OLED display device 101 may have a top-emission type structure.

The first electrode 211 may have a stacked structure. In the stacked structure, a reflective layer and a transparent conductive layer may be stacked. According to an exemplary embodiment of the present invention, the transparent conductive layer of the first electrode 211 may be disposed between the reflective layer and the organic light-emitting layer 212.

The reflective layer may include metal including magnesium (Mg), silver (Ag), gold (Au), calcium (Ca), lithium (Li), chromium (Cr), aluminum (Al), or copper (Cu). The reflective layer may have a thickness of about 200 nm or more.

The transparent conductive layer may include a transparent conductive oxide (TCO), for example, indium tin oxide (ITO), indium zinc oxide (IZO), zinc oxide (ZnO), aluminum zinc oxide (AZO), or indium oxide ($In_2O_3$). The transparent conductive layer may have a relatively high work function. Accordingly, the transparent conductive layer may facilitate hole injection. The transparent conductive layer may facilitate hole injection through the first electrode 211.

The first electrode 211 may have a triple-layered structure. The triple-layered structure may include a transparent conductive layer, a reflective layer, and a transparent conductive layer. The transparent conductive layer, the reflective layer, and the transparent conductive layer may be sequentially stacked. Alternatively, the first electrode 211 may have a single-layered structure. The single-layered structure may include a transparent conductive layer. According to an exemplary embodiment of the present invention, the first electrode 211 may be a transparent electrode.

The second electrode 213 may include a transflective layer. The transflective layer may include a metal including magnesium (Mg), silver (Ag), gold (Au), calcium (Ca), lithium (Li), chromium (Cr), aluminum (Al), copper (Cu), or any combination thereof. The transflective layer may have a thickness of less than about 200 nm. Light transmittance may increase as the thickness of the transflective layer decreases. Light transmittance may decrease as the thickness of the transflective layer increases.

At least one of a hole injection layer or a hole transport layer may be disposed between the first electrode 211 and the organic-light emitting layer 212.

At least one of an electron transport layer and an electron injection layer may be disposed between the organic light-emitting layer 212 and the second electrode 213.

A structure including the organic light-emitting layer 212, the hole injection layer, the hole transport layer, the electron transport layer, and the electron injection layer may be referred to as an organic layer. The organic layer may include a relatively low molecular weight organic material. Alternatively, the organic layer may include a relatively high molecular weight organic material.

The pixel defining layer 190 may have an aperture. The aperture of the pixel defining layer 190 may expose a portion of the first electrode 211. The aperture of the pixel defining layer 190 may include the first electrode 211, the organic light-emitting layer 212, and the second electrode 213. The first electrode 211, the organic light-emitting layer 212, and the second electrode 213 may be sequentially stacked in the aperture of the pixel defining layer 190. The second electrode 213 may be disposed on the pixel defining layer 190 and the organic light-emitting layer 212. At least one of the hole injection layer, the hole transport layer, the electron transport layer, and the electron injection layer may be disposed between the pixel defining layer 190 and the second electrode 213. The OLED 210 may emit light from the organic light-emitting layer 212 disposed in the aperture of the pixel defining layer 190. Thus, the pixel defining layer 190 may define a light emission area.

The thin film encapsulation layer 300 may be disposed on the second electrode 213. The thin film encapsulation layer 300 may protect the OLED 210. The thin film encapsulation layer 300 may reduce or prevent an infiltration of external air, such as moisture or oxygen, from entering into the OLED 210. According to an exemplary embodiment of the present invention, the thin film encapsulation layer 300 may include a first refractive-index control layer 331.

As an example, the thin film encapsulation layer 300 may include at least one first inorganic layer 311 and/or at least one second inorganic layer 312. The thin film encapsulation layer 300 may include at least one organic layer 321. The organic layer 321 may be alternately disposed with the first inorganic layer 311 and/or the second inorganic layer 312. Although the thin film encapsulation layer 300 illustrated in FIG. 2 includes two inorganic layers 311 and 312 and one organic layer 321; exemplary embodiments of the present invention are not limited thereto.

According to an exemplary embodiment of the present invention, the first and second inorganic layers 311 and 312 may each have relatively high refractive indexes. The organic layer 321 may have a relatively low refractive index. However, exemplary embodiments of the present invention are not limited thereto. The organic layer 321 may be disposed adjacent to the OLED 210. The organic layer 321 may have a relatively high refractive index.

The first and second inorganic layers 311 and 312 may each have a refractive index from about 1.6 to about 2.8. The first and second inorganic layers 311 and 312 may each have a thickness of from about 100 nm to about 1,000 nm. The first and second inorganic layers 311 and 312 may each include silver, metal oxide, metal oxynitride, silicon oxide, silicon nitride, silicon oxynitride, or any combination thereof. The first and second inorganic layers 311 and 312 may each have substantially a same refractive index as each other. The first and second inorganic layers 311 and 312 may have substantially a same thickness as each other. The first and second inorganic layers 311 and 312 may include substantially a same material as each other.

For example, the first and second inorganic layers 311 and 312 may include an inorganic material including $Al_2O_3$, $TiO_2$, $ZrO$, $SiO_2$, AlON, AlN, SiON, $Si_3N_4$, ZnO, $Ta_2O_5$, or any combination thereof. The first and second inorganic layers 311 and 312 may each be formed through methods such as a chemical vapor deposition (CVD) method or an atomic layer deposition (ALD) method. However, exemplary embodiments of the present invention are not limited thereto. The first and second inorganic layers 311 and 312 may be formed using various methods known to those skilled in the art.

The organic layer 321 may have a refractive index from about 1.4 to about 1.6. The organic layer 321 may have a thickness of from about 100 nm to about 8,000 nm. The organic layer 321 may include at least one of an acrylate resin, a methacrylate resin, a sulfide resin, an epoxy resin, polyimide, or polyethylene.

For example, the organic layer 321 may include a polymer-based material. The polymer-based material may include, for example, an acrylic resin, an epoxy resin, polyimide, or polyethylene. The organic layer 321 may be formed through a thermal deposition process. The thermal deposition process for forming the organic layer 321 may be performed at a predetermined temperature range. The predetermined temperature range might not damage the OLED 210. However, exemplary embodiments of the present invention are not limited thereto. The organic layer 321 may be formed using various methods known to those skilled in the art.

The first and second inorganic layers 311 and 312 may have a relatively high density thin film. The first and second inorganic layers 311 and 312 may prevent or reduce infiltration of moisture or oxygen from entering into the OLED 210. Infiltration of moisture and oxygen into the OLED 210 may be reduced or prevented by the first and second inorganic layers 311 and 312.

Moisture and oxygen that have passed through the first and second inorganic layers 311 and 312 may be blocked by the organic layer 321. The organic layer 321 may have a relatively low moisture-infiltration preventing efficacy relative to the first and second inorganic layers 311 and 312. However, the organic layer 321 may also serve as a buffer layer. The organic layer 321 serving as the buffer layer may reduce stress among the first or second inorganic layers 311 and 312 and the organic layer 321. Since the organic layer 321 may have planarization characteristics, a surface of the thin film encapsulation layer 300 may be planarized by the organic layer 321. For example, an upper surface of the thin film encapsulation layer 300 may be planarized by the organic layer 321.

The thin film encapsulation layer 300 may have a thickness of about 50 μm or less. The thin film encapsulation layer 300 may have a thickness of about 10 μm or less. Accordingly, the OLED display device 101 may have a relatively small thickness.

A sealing substrate may be disposed on the thin film encapsulation layer 300. The sealing substrate may protect the OLED 210. The sealing substrate may be disposed on a side of the OLED 210 opposite the substrate 110. The sealing substrate may be disposed on the substrate 110. The sealing substrate may include a transparent insulating substrate. The transparent insulating substrate may include glass, quartz, ceramic, or plastic. When the sealing substrate is omitted, a flexible characteristic of the OLED display device 101 may be increased.

Figure 3:
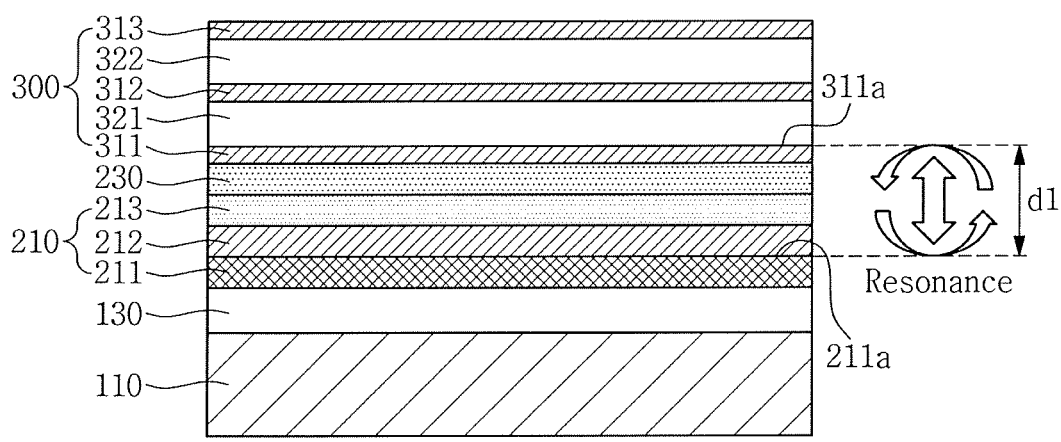
FIG. 3 is a cross-sectional view illustrating resonance in an OLED display device according to an exemplary embodiment of the present invention.

FIG. 3 is a cross-sectional view illustrating resonance in an OLED display device according to an exemplary embodiment of the present invention. FIG. 3 illustrates a stacked structure of an OLED display device.

Referring to FIG. 3, an OLED display device may have a multi-layered stacked structure. Light emitted from an organic light-emitting layer 212 may be emitted outwards through the multi-layered stacked structure.

An organic layer may have a relatively lower refractive index than a refractive index of an inorganic layer. For example, the first and second inorganic layers 311 and 312 may each have a refractive index of about 1.75. The organic layer 321 may have a refractive index of about 1.5. Accordingly, a refractive-index difference may occur at an interfacial surface between the first or second inorganic layers 311 and 312 and the organic layer 321. An interfacial surface between two layers that have a relatively large refractive-index difference may become a reflective surface.

Referring to FIGS. 2 and 3, an inorganic layer of the first and second inorganic layers 311 and 312 closest to a lowermost portion of the thin film encapsulation layer 300, for example, closest to the OLED 210, may be referred to as the first inorganic layer 311. Resonance will be described in more detail below with respect to the first inorganic layer 311 and the organic layer 321.

Referring to FIG. 3, an interfacial surface 311a may be disposed between the first inorganic layer 311 and the organic layer 321. The interfacial surface 311a may be a reflective layer. In a top emission-type OLED display device, the first electrode 211 may be a reflective electrode. Accordingly, light may be reflected from a surface 211a of the first electrode 211.

When light repeatedly reflects among two reflective surfaces, optical resonance may occur. When optical resonance occurs, energy of light may increase. Light having the increased energy may relatively readily pass through the multi-layered stacked structure and may be emitted outwards. Such a structure allowing light resonance among two reflective layers may be referred to as a resonance structure. A distance among the two reflective layers among which resonance occurs may be referred to as a resonance distance. The resonance distance may vary based on a wavelength of light.

For example, when a wavelength of light emitted from the organic light-emitting layer 212 is "λ1" and a distance between the surface 211a of the first electrode 211 and the interfacial surface 311a between the first inorganic layer 311 and the organic layer 321 is "d1," light resonance may occur when the following Formula 1 is satisfied.

$$d1 = m1 \cdot \lambda 1 \qquad \text{[Formula 1]}$$

In Formula 1, "m1" may be a natural number.

According to an exemplary embodiment of the present invention, the first inorganic layer 311 may be formed through methods such as a chemical vapor deposition (CVD) method or an atomic layer deposition (ALD) method. However, a layer thickness may vary due to process errors. For example, a layer thickness may vary based on a position in the first inorganic layer 311.

When the thickness of the first inorganic layer 311 varies, a wavelength of light resonated between the surface 211a of the first electrode 211 and the interfacial surface 311a between the first inorganic layer 311 and the organic layer 321 may vary.

Figure 4:
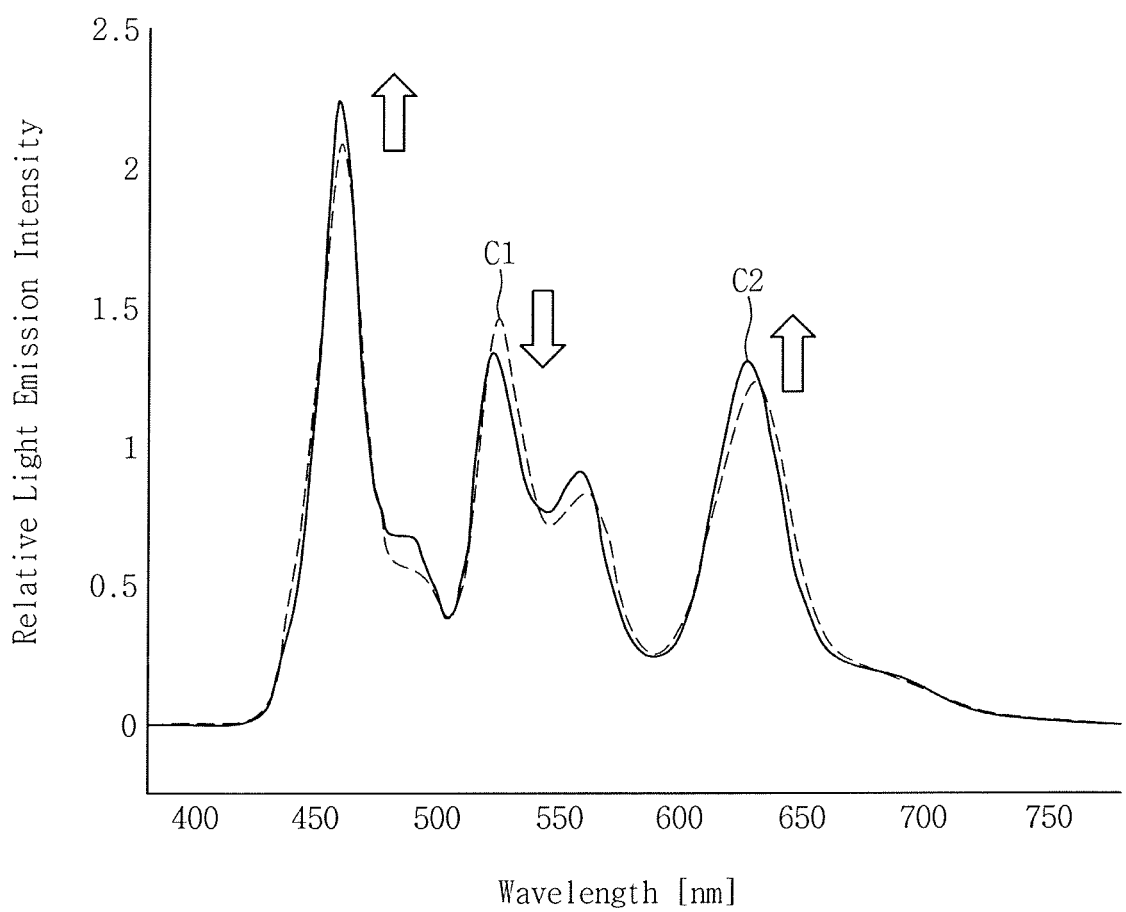
FIG. 4 is a light emission spectrum graph of an OLED display device based on wavelength according to an exemplary embodiment of the present invention.

FIG. 4 is a light emission spectrum graph of an OLED display device based on wavelength according to an exemplary embodiment of the present invention.

Referring to FIG. 4, "C1" may denote a relative light emission intensity based on wavelength of light when the thickness of the first inorganic layer 311 is about 1 μm. "C2" may denote a relative light emission intensity based on wavelength of light when the thickness of the first inorganic layer 311 is about 1.05 μm. When the thickness of the first inorganic layer 311 is changed by about 0.05 μm, (i.e., about 50 nm), the light emission intensity based on wavelength of light may vary.

The OLED display device may include a plurality of pixels. Due to process errors, the first inorganic layer 311 disposed on the OLED 210 may have different thicknesses corresponding to respective pixels. For example, when a thickness of the first inorganic layer 311 on, for example, red OLEDs 210 is not uniform, light emission intensity of a red color may vary corresponding to each pixel, which may be similar to a green pixel or a blue pixel.

Figure 5:
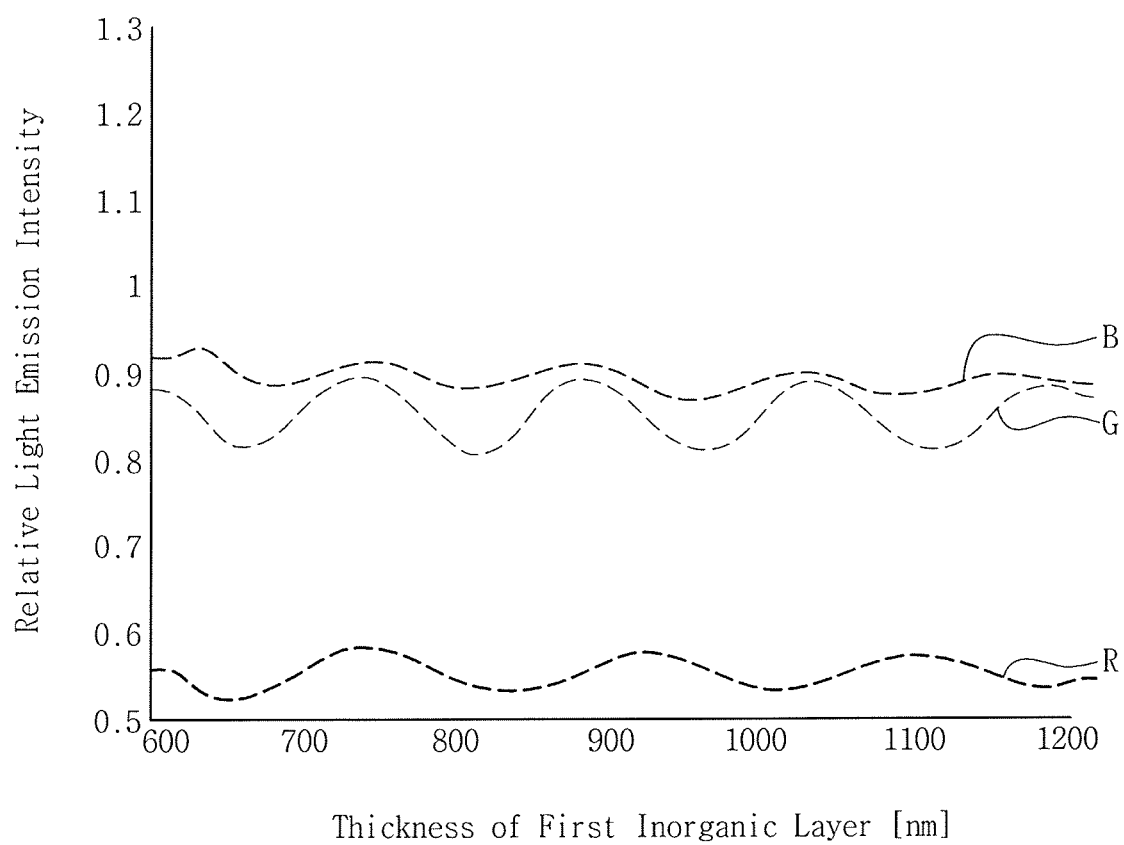
FIGS. 5 and 6 are light emission spectrum graphs of an OLED display device based on thickness of a first inorganic layer according to an exemplary embodiment of the present invention.
Figure 6:
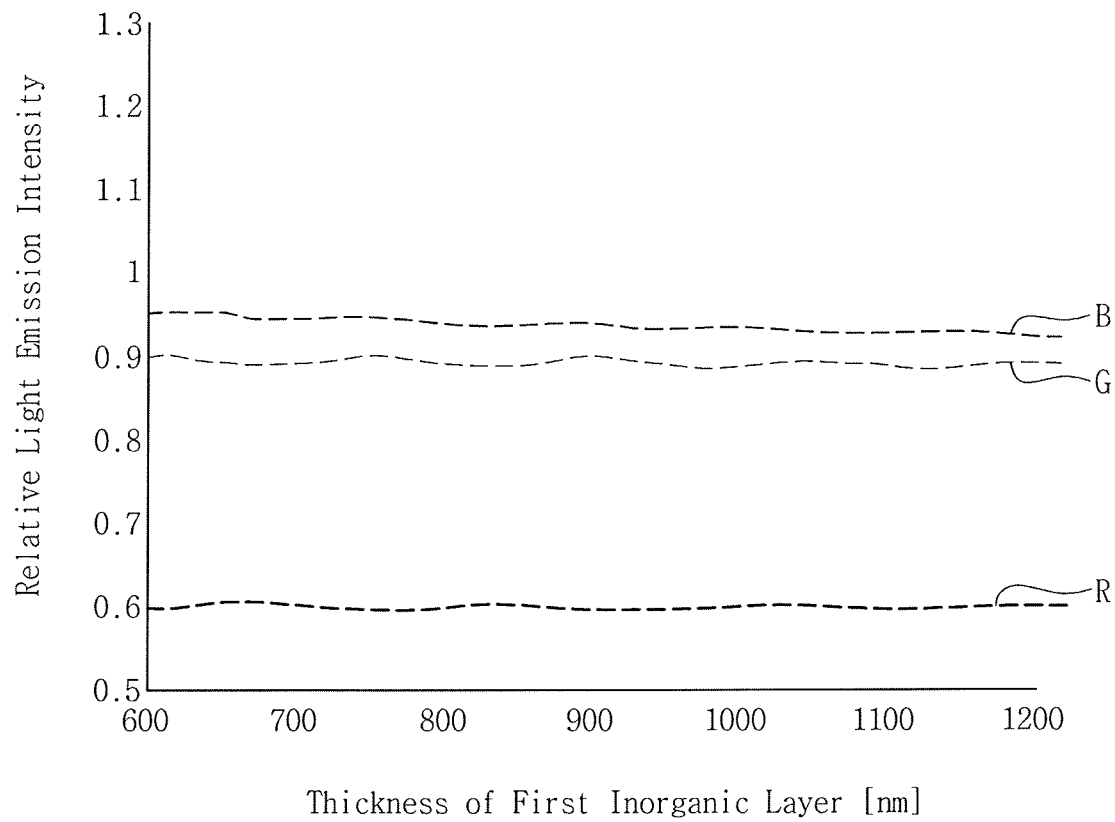

FIGS. 5 and 6 are light emission spectrum graphs of an OLED display device based on thickness of a first inorganic layer according to an exemplary embodiment of the present invention.

FIG. 5 is a light emission spectrum graph of an OLED display device based on thickness of a first inorganic layer according to an exemplary embodiment of the present invention. Referring to FIG. 5, as the thickness of the first inorganic layer 311 varies, light emission intensities of a red color R, a green color G, and a blue color B may vary.

When the interfacial surface 311a disposed between the first inorganic layer 311 and the organic layer 321 serves as a reflective layer, where the thickness of the first inorganic layer 311 varies, a wavelength of light resonated between the surface 211a of the first electrode 211 and the interfacial surface 311a between the first inorganic layer 311 and the organic layer 321 may vary. A limit in forming a uniform thickness of the first inorganic layer 311 in a manufacturing process and the thickness of the first inorganic layer 311 may vary based on position due to process errors. Accordingly, pixels representing a same color may exhibit different light emission efficiencies based on position.

According to an exemplary embodiment of the present invention, a first refractive-index control layer 331 may be disposed among one of the first and second inorganic layers 311 and 312 and the organic layer 321 that are adjacent to each other. The first refractive-index control layer 331 may be disposed between the first inorganic layer 311 and the organic layer 321. The first refractive-index control layer 331 may have a refractive-index gradient along a thickness direction. The thickness direction may refer to a direction from the OLED 210 toward the thin film encapsulation layer 300.

Referring to FIG. 2, the first refractive-index control layer 331 may be disposed between the first inorganic layer 311 and the organic layer 321. According to an exemplary embodiment of the present invention, a direction from the first inorganic layer 311 toward the organic layer 321 may correspond to the thickness direction. However, exemplary embodiments of the present invention are not limited thereto.

According to an exemplary embodiment of the present invention, a refractive index of the first refractive-index control layer 331 may decrease in a relatively gradual manner along a direction from the first inorganic layer 311 toward the organic layer 321. The refractive index of the first refractive-index control layer 331 may increase in a relatively gradual manner along a direction from the organic layer 321 toward the first inorganic layer 311.

Referring to FIG. 2, as the refractive index of the first refractive-index control layer 331 varies in a relatively gradual manner along the direction from the first inorganic layer 311 toward the organic layer 321, a reflective surface might not be formed between the first inorganic layer 311 and the organic layer 321. Accordingly, light resonance might not occur between the first inorganic layer 311 and the organic layer 321. Accordingly, although the thickness of the first inorganic layer 311 may vary based on position due to process errors, a deviation in light emission efficiency due to light resonance might not occur. A deviation in light emission intensity based on the thickness of the first inorganic layer 311 might not occur. Accordingly, the OLED display device 101 may have substantially uniform light emission efficiency based on pixels and position.

FIG. 6 is a light emission spectrum graph of an OLED display device based on thickness of a first inorganic layer according to an exemplary embodiment of the present invention. As an example, the OLED display device 101 will be described in more detail below; however, exemplary embodiments of the present invention are not limited thereto.

Referring to FIG. 6, although the thickness of the first inorganic layer 311 may vary, the light emission intensities of a red color R, a green color G, and a blue color B do not extensively vary. Thus, a deviation of light emission intensity based on the thickness of the first inorganic layer 311 may be reduced or eliminated.

The first refractive-index control layer 331 disposed between the first inorganic layer 311 and the organic layer 321 may protect the OLED 210. The first refractive-index control layer 331 may assist in directing the light emitted from the organic light-emitting layer 212 outwards.

Figure 7:
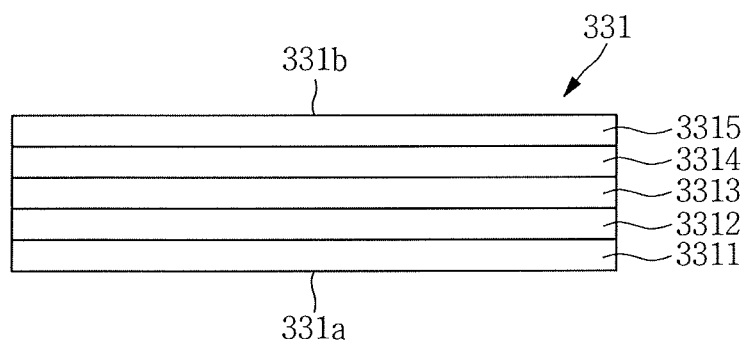
FIG. 7 is a cross-sectional view illustrating a first refractive-index control layer according to an exemplary embodiment of the present invention.

FIG. 7 is a cross-sectional view illustrating a first refractive-index control layer according to an exemplary embodiment of the present invention.

Referring to FIG. 7, the first refractive-index control layer 331 may include the first surface 331a. The first surface 331a may face toward the first inorganic layer 311. The first refractive-index control layer 331 may also include a second surface 331b. The second surface 331b may face toward the organic layer 321. The first refractive-index control layer 331 may have a multi-layered structure. Alternatively, the first refractive-index control layer 331 may have a single-layered structure. The first refractive-index control layer 331 may have a refractive-index gradient. The refractive-index gradient may vary in a relatively gradual manner. A refractive index of the first surface 331a of the first refractive-index control layer 331 may be lower than or substantially equal to a refractive index of the first inorganic layer 311. A refractive index of the second surface 331b of the first refractive-index control layer 331 may be higher than or substantially equal to the refractive index of the organic layer 321. The first refractive-index control layer 331 may have a refractive index from about 1.5 to about 1.8.

The first surface 331a may have a higher refractive index than a refractive index of the second surface 331b. The first surface 331a may have a higher refractive index than a refractive index of the second surface 331b by about 0.1 to about 0.3. Thus, the first refractive-index control layer 331 may have a refractive-index difference from about 0.1 to about 0.3.

The first refractive-index control layer 331 may have a refractive-index variation ratio per unit length ($\Delta n$/nm) along the thickness direction. The refractive-index variation ratio per unit length ($\Delta n$/nm) may range from about 0.001/nm to about 0.002/nm. The refractive-index variation ratio per unit length ($\Delta n$/nm) may refer to a variation ratio per 1 nm along the thickness direction.

With respect to the thickness of about 500 Å, the first refractive-index control layer 331 may have a refractive-index variation ratio ($\Delta n$/nm) from about 0.05/500 Å to about 0.01/500 Å along the thickness direction.

When the refractive-index variation ratio per unit length ($\Delta n$/nm) is about 0.001/nm along the thickness direction, the first refractive-index control layer 331 having a thickness of about 250 nm may have a refractive-index gradient of about 0.25. For example, when the refractive index of the first inorganic layer 311 is about 1.75 and the refractive index of the organic layer 321 is about 1.5, a refractive-index gradient may be substantially continuous between the first inorganic layer 311 and the organic layer 321. The refractive-index gradient may be substantially continuous between the first layer 311 and the organic layer 321 due to the first refractive-index control layer 331.

When the refractive-index variation ratio per unit length (Δn/nm) is about 0.002/nm along the thickness direction, the first refractive-index control layer 331 having a thickness of about 125 nm may have a refractive-index gradient of about 0.25.

When the refractive-index variation ratio per unit length (Δn/nm) is from about 0.001/nm to about 0.002/nm along the thickness direction, the first refractive-index control layer 331 having a relatively small thickness from about 125 nm to about 250 nm may have a substantially continuous refractive-index gradient between the first inorganic layer 311 and the organic layer 321.

According to an exemplary embodiment of the present invention, the first refractive-index control layer 331 may have a thickness of from about 100 nm to about 250 nm. However, exemplary embodiments of the present invention are not limited thereto. For example, the thickness of the first refractive-index control layer 331 may vary.

The first refractive-index control layer 331 may include at least one of an inorganic material or an organic material. The inorganic material and the organic material may have a light transmittance. For example, the first refractive-index control layer 331 may include an inorganic layer or an organic layer. Alternatively, the first refractive-index control layer 331 may include an organic layer including an inorganic material.

The first refractive-index control layer 331 may include at least two materials. The materials included in the first refractive-index control layer 331 may have different refractive indices. For example, a relatively high refractive-index material and a relatively low refractive-index material may be included in the first refractive-index control layer 331.

The relatively low refractive-index material may have a refractive index from about 1.4 to about 1.6. The relatively high refractive-index material may have a refractive index from about 1.7 to about 2.8.

For example, the first refractive-index control layer may include low refractive-index material selected from silicon oxide, magnesium fluoride, acrylic polymer, polyimide, polyamide, Alq$_3$[Tris(8-hydroxyquinolinato)aluminium], or any combination thereof.

The first refractive-index control layer 331 may include a relatively high refractive-index material. The relatively high refractive-index material may include zinc oxide, titanium oxide, zirconium oxide, niobium oxide, tantalum oxide, tin oxide, nickel oxide, silicon nitride, indium nitride, gallium nitride, poly(3,4-ethyenedioxythiophene) (PEDOT), 4,4'-bis[N-(3-methylphenyl)-N-phenylamino]biphenyl (TPD), 4,4',4"-tris[(3-methylphenyl)phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino]benzene (m-MTDAB), 1,3,5-tris [N,N-bis (4-methylphenyl)amino]benzene (p-MTDAB), 4,4'-bis[N,N-bis(3-methylphenyl)-amino]diphenylmethane (BPPM), 4,4-dicarbazolyl-1,1'-biphenyl (CBP), 4,4',4"-tris(N-carbazole) triphenylamine (TCTA), 2,2',2"-(1,3,5-benzenetolyl)tris-[1-phenyl-1H-benzoimidazol](TPBI), 3-(4-biphenyl)-4-phenyl-5-t-butylphenyl-1,2,4-triazole (TAZ), or any combination thereof.

According to an exemplary embodiment of the present invention, the first refractive-index control layer 331 may include at least one relatively low refractive-index material and at least one relatively high refractive-index material.

However, exemplary embodiments of the present invention are not limited thereto. The first refractive-index control layer 331 may be manufactured by those skilled in the art using various materials known in the art.

The first refractive-index control layer 331 may be manufactured in methods known in the art. For example, the first refractive-index control layer 331 may be formed using methods such as a chemical vapor deposition (CVD) method or an atomic layer deposition (ALD) method.

As an example, in a deposition process to form the first refractive-index control layer 331, a relatively high refractive-index material and a relatively low refractive-index material may be used together. As an amount of deposition or a deposition ratio of the relatively high refractive-index material and the relatively low refractive-index material is adjusted, the first refractive-index control layer 331 may be manufactured to have a refractive-index gradient along the thickness direction.

The first refractive-index control layer 331 may include substantially a same material as a material included in the first and second inorganic layers 311 and 312. The first refractive-index control layer 331 may be manufactured through a process which is substantially continuously performed subsequent to forming the first inorganic layer 311. For example, when the first inorganic layer 311 is manufactured through a deposition method, after the first inorganic layer 311 is formed, the first refractive-index control layer 331 may be manufactured through further deposition methods.

Although a boundary between the first refractive-index control layer 331 and the first inorganic layer 311 is illustrated in FIG. 2; exemplary embodiments of the present invention are not limited thereto. The first refractive-index control layer 331 and the first inorganic layer 311 may have a substantially continuous refractive-index gradient omitting the boundary. The boundary between the first refractive-index control layer 331 and the first inorganic layer 331 as used herein may refer to an area in which the first refractive-index control layer 331 and the first inorganic layer 311 are in contact with each other. For example, an upper surface of the first inorganic layer 311 may be in direct contact with a bottom surface of the first refractive-index control layer 331.

Referring to FIG. 7, the first refractive-index control layer 331 may have a multi-layered structure. For example, the first refractive-index control layer 331 may include a first matching layer 3311 and a second matching layer 3312. The first matching layer 3311 may be disposed on the first inorganic layer 331. The second matching layer 3312 may be disposed on the first matching layer 3311.

The first matching layer 3311 and the second matching layer 3312 may have a refractive-index difference from about 0.05 to about 0.1. For example, the first matching layer 3311 may have a refractive index that is relatively higher than a refractive index of the second matching layer 3312. The first matching layer 3311 may have a refractive index that is relatively higher than a refractive index of the second matching layer 3312 by about 0.05 to about 0.1.

The first refractive-index control layer 331 may be disposed on the second matching layer 3312. The first refractive-index control layer 331 may include a third matching layer 3313. The third matching layer 3313 may have a relatively lower refractive index than a refractive index of the second matching layer 3312. Referring to FIG. 7, the first refractive-index control layer 331 may have a structure including a fourth matching layer 3314 and/or a fifth matching layer 3315. The fourth matching layer 3314 may be disposed on the third matching layer 3313. The fifth matching layer 3315 may be disposed on the fourth matching layer 3314. According to an exemplary embodiment of the present invention, the fourth matching layer 3314 may have a relatively lower refractive index than a refractive index of the third matching layer 3313. The fifth matching layer 3315 may have a relatively lower refractive index than a refractive index of the fourth matching layer 3314.

The structure of the first refractive-index control layer 331 is not limited to the structure illustrated in FIG. 7. The structure of the first refractive-index control layer 331 may be modified. For example, the first refractive-index control layer 331 may have a structure of double layers, triple layers, or quadruple layers. The first refractive-index control layer 331 may have a multi-layered structure of more than six layers. The first refractive-index control layer 331 may have a monolayer structure. The monolayer structure may have a refractive-index gradient varying in a relatively gradual manner.

Referring to FIG. 7, when a refractive-index difference among each corresponding pair of the matching layers 3311, 3312, 3313, 3314, and 3315, included in the first refractive-index control layer 331, is about 0.05, the first surface 331a and the second surface 331b of the first refractive-index control layer 331 may have a refractive-index difference of about 0.25.

For example, when the first inorganic layer 311 has a refractive index of about 1.75, the organic layer 321 may have a refractive index of about 1.5. The first refractive-index control layer 331 may be disposed between the first inorganic layer 311 and the organic layer 321. An interfacial surface having a refractive-index difference of about 0.1 or higher might not exist between the first inorganic layer 311 and the organic layer 321. Accordingly, light might not be reflected while passing through the first inorganic layer 311, the first refractive-index control layer 331, and the organic layer 321. Accordingly, a deviation of light emission efficiency due to a thickness deviation of the first inorganic layer 311 might not occur.

Each of the first, second, third, fourth, and fifth matching layers 3311, 3312, 3313, 3314, and 3315 may have a thickness of from about 25 nm to about 60 nm.

For example, each of the first, second, third, fourth, and fifth matching layers 3311, 3312, 3313, 3314, and 3315 may have a thickness of about 50 nm. Alternatively, each of the first, second, third, fourth, and fifth matching layers 3311, 3312, 3313, 3314, and 3315 may have a thickness of about 40 nm.

Figure 8:
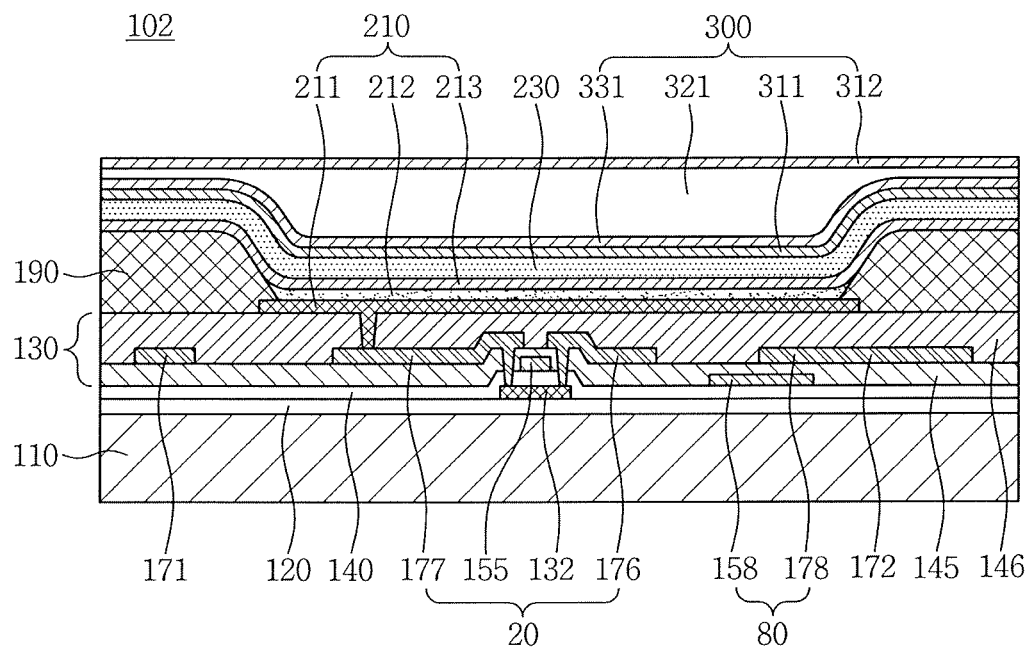
FIG. 8 is a cross-sectional view illustrating an OLED display device according to an exemplary embodiment of the present invention.

FIG. 8 is a cross-sectional view illustrating an OLED display device according to an exemplary embodiment of the present invention. Descriptions pertaining to configurations previously described may be omitted.

An OLED display device 102 may include a capping layer 230. The capping layer 230 may be disposed between the OLED 210 and the thin film encapsulation layer 300. Referring to FIG. 8, the capping layer 230 may be disposed between the second electrode 213 and the first inorganic layer 311.

The capping layer 230 may transmit light. The capping layer 230 may protect the OLED 210. The capping layer 230 may allow light emitted from the organic light-emitting layer 212 to be emitted outwards.

The capping layer 230 may include an inorganic material and/or an organic material. The inorganic material and the organic material may transmit light. Thus, the capping layer 230 may include an inorganic layer or an organic layer. Alternatively, the capping layer 230 may include an organic layer including inorganic particles.

The capping layer 230 may include at least two different materials. The materials included in the capping layer 230 may have different refractive indices from each other. For example, the capping layer 230 may include a relatively high refractive-index material and a relatively low refractive-index material. The relatively high refractive-index material and the relatively low refractive-index material may each be an organic material or an inorganic material.

The capping layer 230 may have a thickness of from about 80 nm to about 300 nm. Alternatively, the capping layer 230 may have a thickness of about 300 nm or greater. For example, the capping layer 230 may have a thickness of about 300 nm to about 900 nm or more. As the capping layer 230 has a greater thickness, the OLED 210 may be increasingly protected. However, when the capping layer 230 is relatively thick, the OLED display device 102 may experience difficulty in achieving a thin film structure.

The capping layer 230 may be manufactured through methods known in the pertinent art. For example, the capping layer 230 may be manufactured through deposition. In a deposition process for manufacturing the capping layer 230, a relatively high refractive-index material and a relatively low refractive-index material may be used together. As an amount of deposition or a deposition ratio of the relatively high refractive-index material and the relatively low refractive-index material is adjusted, a refractive index of the capping layer 230 may be adjusted.

Figure 9:
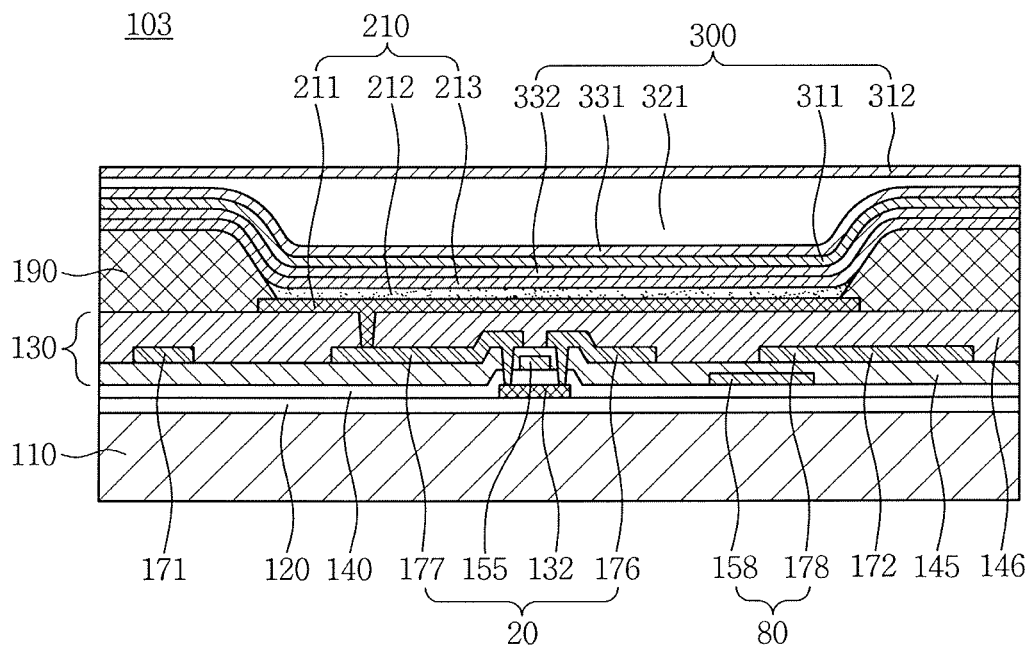
FIG. 9 is a cross-sectional view illustrating an OLED display device according to an exemplary embodiment of the present invention.

FIG. 9 is a cross-sectional view illustrating an OLED display device according to an exemplary embodiment of the present invention.

An OLED display device 103 may include a second refractive-index control layer 332. The second refractive-index control layer may be disposed between the OLED 210 and the first inorganic layer 311. The thin film encapsulation layer 300 may include the second refractive-index control layer 332. The second refractive-index control layer 332 may be disposed opposite to the first refractive-index control layer 331 with respect to the first inorganic layer 311. For example, as illustrated in FIG. 9, the first refractive-index control layer 331 may be disposed above the first inorganic layer 311. The second refractive-index control layer 332 may be disposed below the first inorganic layer 311.

The second refractive-index control layer 332 may include substantially a same material as a material included in the first refractive-index control layer 331. The second refractive-index control layer 332 may have a refractive-index variation ratio per unit length (Δn/nm) from about 0.001/nm to about 0.002/nm along a thickness direction. According to an exemplary embodiment of the present invention, the second refractive-index control layer 332 may have a refractive index between a refractive index of a second electrode 213 and a refractive index of the first inorganic layer 311.

The second refractive-index control layer 332 may have a multi-layered structure. The multi-layered structure may include a plurality of matching layers. According to an exemplary embodiment of the present invention, respective layers of the matching layers may have different refractive indices from each other. The second refractive-index control layer 332 may have a monolayer structure. The monolayer structure may have a refractive-index gradient varying in a relatively gradual manner.

Figure 10:
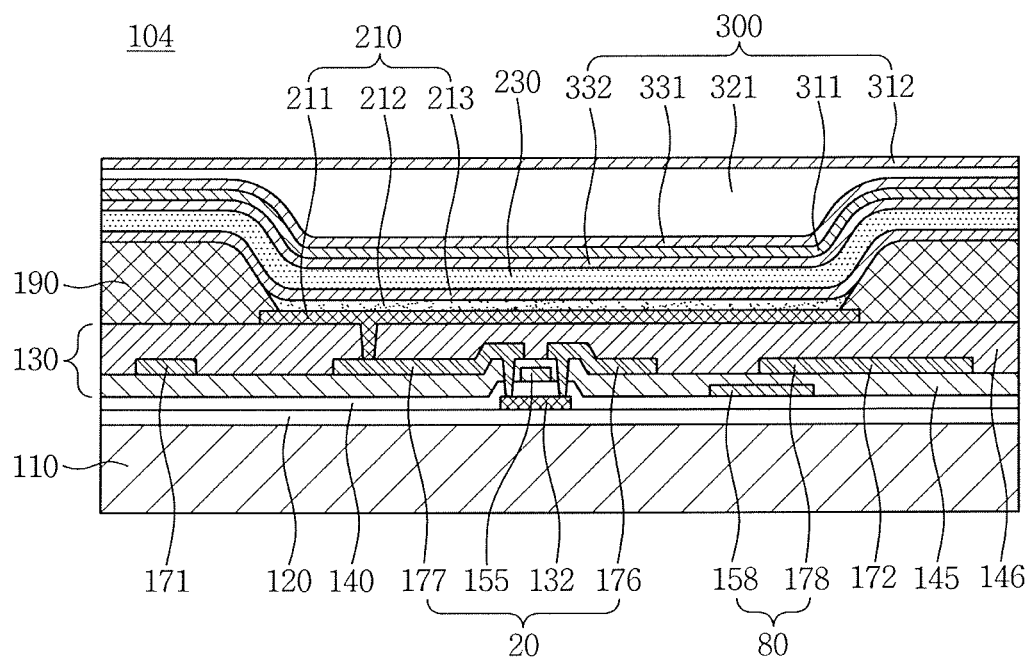
FIG. 10 is a cross-sectional view illustrating an OLED display device according to an exemplary embodiment of the present invention.

FIG. 10 is a cross-sectional view illustrating an OLED display device according to an exemplary embodiment of the present invention.

An OLED display device 104 may include a capping layer 230 disposed between the OLED 210 and the second refractive-index control layer 332.

Figure 11:
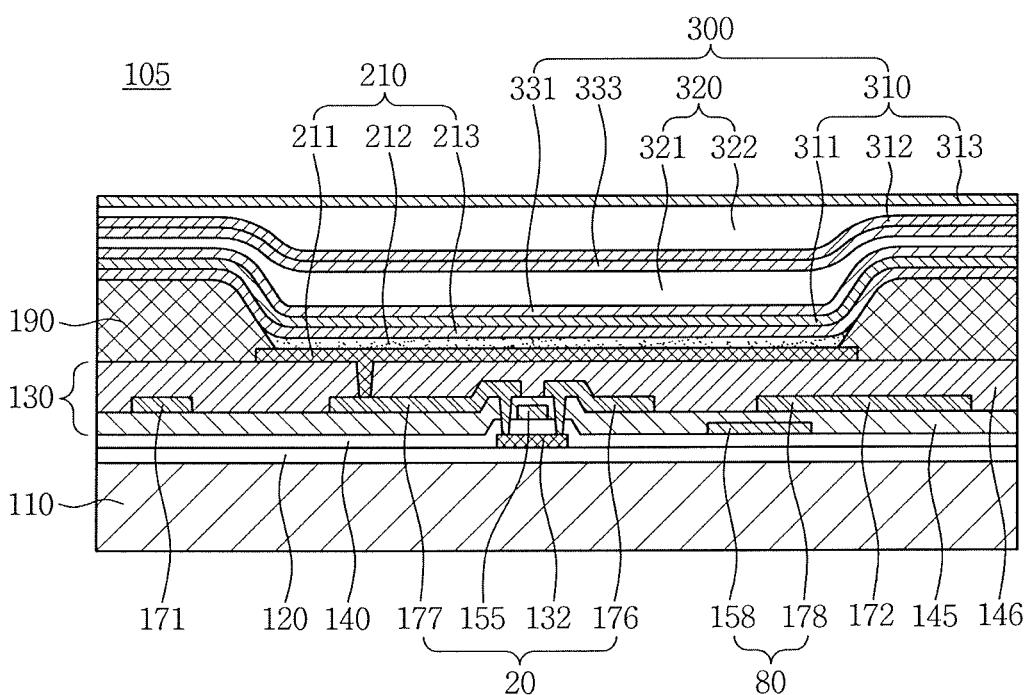
FIG. 11 is a cross-sectional view illustrating an OLED display device according to an exemplary embodiment of the present invention.

FIG. 11 is a cross-sectional view illustrating an OLED display device according to an exemplary embodiment of the present invention.

An OLED display device 105 may include the thin film encapsulation layer 300. The thin film encapsulation layer 300 may include a plurality of inorganic layers 310, a plurality of organic layers 320, and a plurality of refractive-index control layers 331 and 333.

As an example, the thin film encapsulation layer 300 may include at least three inorganic layers 311, 312, and 313 and at least two organic layers 321 and 322. The organic layers 321 and 322 may be disposed alternately with the three inorganic layers 311, 312, and 313. One of the two organic layers 321 and 322 that is closer to an OLED 210 (e.g., the organic layer 321 adjacent to the first inorganic layer 311), may be referred to as a first organic layer.

The thin film encapsulation layer 300 may include the first refractive-index control layer 331. The first refractive-index control layer 331 may be disposed between the first inorganic layer 311 and the organic layer 321. The thin film encapsulation layer 300 may include a third refractive-index control layer 333. The third refractive-index control layer 333 may be disposed opposite to the first refractive-index control layer 331 with respect to the organic layer 321. For example, the third refractive-index control layer 333 may be disposed above the first inorganic layer 321. The first refractive-index control layer 331 may be disposed below the first inorganic layer 321.

The third refractive-index control layer 333 may include substantially a same material as a material included in the first refractive-index control layer 331. The third refractive-index control layer 333 may have a refractive-index variation ratio per unit length ($\Delta n/nm$) from about 0.001/nm to about 0.002/nm along a thickness direction. The third refractive-index control layer 333, dissimilar to the first refractive-index control layer 331, may have a refractive index increasing along a thickness direction from the adjacent organic layer 321 toward the second inorganic layer 312.

According to an exemplary embodiment of the present invention, the third refractive-index control layer 333 may have a refractive index between a refractive index of the adjacent organic layer 321 and a refractive index of the second inorganic layer 312.

The third refractive-index control layer 333 may have a multi-layered structure. The multi-layered structure may include a plurality of matching layers. According to an exemplary embodiment of the present invention, respective layers of the matching layers may have different refractive indices from each other. A refractive index of each of the matching layers may increase along the thickness direction from the adjacent organic layer 321 toward the second inorganic layer 312. The third refractive-index control layer 333 may have a monolayer structure. The monolayer structure may have a refractive-index gradient varying in a relatively gradual manner.

Figure 12:
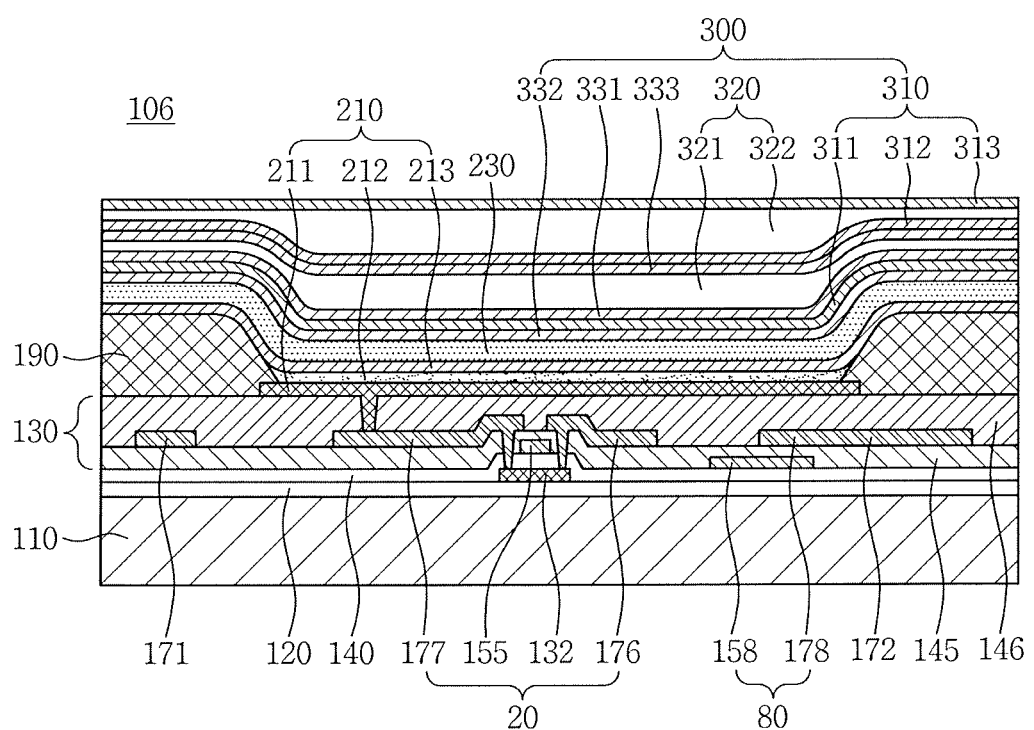
FIG. 12 is a cross-sectional view illustrating an OLED display device according to an exemplary embodiment of the present invention.

FIG. 12 is a cross-sectional view illustrating an OLED display device according to an exemplary embodiment of the present invention.

An OLED display device 106 may include a capping layer 230 and a second refractive-index control layer 332 disposed between the OLED 210 and the first inorganic layer 311.

Figure 13:
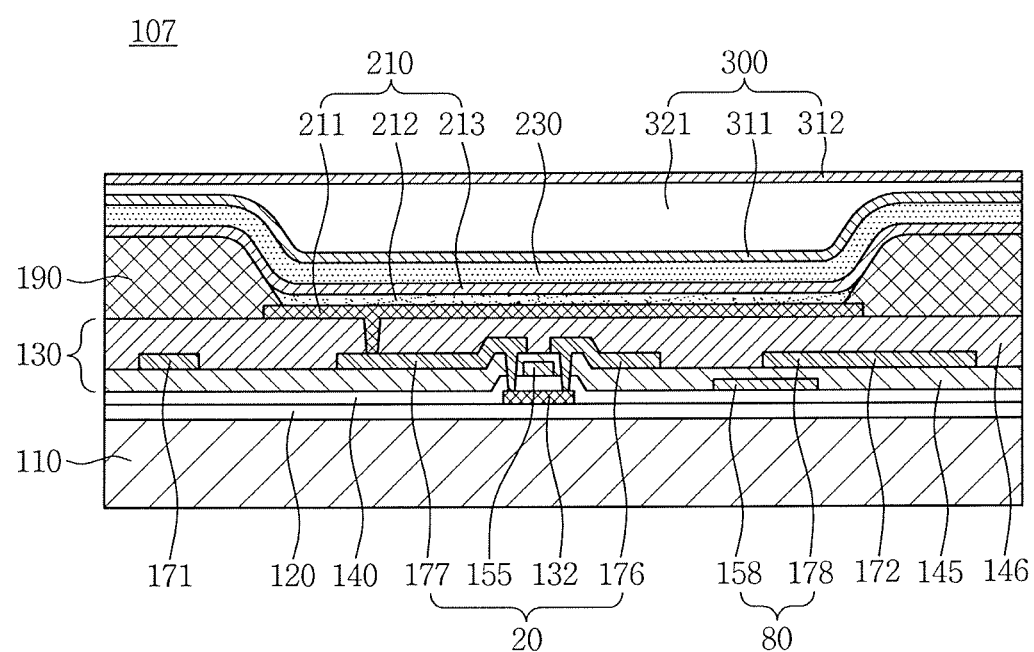
FIG. 13 is a cross-sectional view illustrating an OLED display device according to an exemplary embodiment of the present invention.

FIG. 13 is a cross-sectional view illustrating an OLED display device according to an exemplary embodiment of the present invention.

Referring to FIG. 13, an OLED display device 107 may include the substrate 110, the OLED 210, and the thin film encapsulation layer 300. The OLED 210 may be disposed on the substrate 110. The thin film encapsulation layer 300 may be disposed on the OLED 210. The thin film encapsulation layer 300 may include the first inorganic layer 311 and/or the second inorganic layer 312 and at least one organic layer 321. The organic layer 321 may be alternately disposed with the first and second inorganic layers 311 and 312. The OLED display device 107 may include a capping layer 230. The capping layer 230 may be disposed between the OLED 210 and the thin film encapsulation layer 300.

According to an exemplary embodiment of the present invention, the first and second inorganic layers 311 and 312 may have a refractive index. The refractive index may range from about 1.75 to about 2.55. The first and second inorganic layers 311 and 312 may also have a refractive-index difference. The refractive-index difference between at least one of the first and second inorganic layers 311 and 312 and the organic layer 321 may be about 0.15. For example, the first inorganic layer 311 and the organic layer 321 may have substantially a same refractive index. The first inorganic layer 311 and the organic layer 321 may each have a refractive-index difference of about 0.15 or less.

According to an exemplary embodiment of the present invention, the organic layer 321 may have a relatively high refractive index. For example, the first inorganic layer 311 and the organic layer 321 may have a refractive-index difference of about 0.06 or less. According to an exemplary embodiment of the present invention, light reflection might not occur at an interfacial surface between the first inorganic layer 311 and the organic layer 321.

For example, the organic layer 321 may have a refractive index from about 1.6 to about 2.4.

The organic layer 321 may include an organic material. The organic material may have a relatively high refractive-index. For example, the organic layer 321 may include at least one of poly(3,4-ethylenedioxythiophene) (PEDOT), 4,4'-bis[N-(3-methylphenyl)-N-phenylamino]biphenyl (TPD), 4,4',4"-tris[(3-methylphenyl)phenylamino]triphenylamine (m-MTDATA), 1,3,5-tris [N,N-bis(2-methylphenyl)-amino]benzene (o-MTDAB), 1,3,5-tris[N,N-bis(3-methylphenyl)-amino]benzene (m-MTDAB), 1,3,5-tris [N,N-bis (4-methylphenyl)amino]benzene (p-MTDAB), 4,4'-bis[N,N-bis(3-methylphenyl)-amino]diphenylmethane (BPPM), 4,4-dicarbazolyl-1,1'-biphenyl (CBP), 4,4',4"-tris (N-carbazole) triphenylamine (TCTA), 2,2',2"-(1,3,5-benzenetolyl)tris-[1-phenyl-1H-benzoimidazol](TPBI), or 3-(4-biphenyl)-4-phenyl-5-t-butylphenyl-1,2,4-triazole (TAZ).

According to one or more exemplary embodiments of the present invention, an OLED display device may include a refractive-index control layer. Accordingly, a light emission deviation of an OLED may be reduced. Thus, light emitting characteristics of the OLED display device may increase.

While the present invention has been shown and described with reference to the exemplary embodiments thereof, it will be apparent to those of ordinary skill in the art that various changes in form and detail may be made thereto without departing from the spirit and scope of the present invention.

The invention claimed is:
1. A display device, comprising:
a substrate;
an organic light-emitting diode disposed on the substrate, the organic light-emitting diode including a first electrode, an organic light-emitting layer disposed on the first electrode, and a second electrode disposed on the organic light-emitting layer; and a thin film encapsulation layer disposed on the organic light-emitting diode, wherein the thin film encapsulation layer comprises:

a first inorganic layer;

a first refractive-index control layer disposed directly above the first inorganic layer;

a second refractive-index control layer disposed directly below the first inorganic layer, wherein each of the first and second refractive-index control layers includes a plurality of matching layers;

an organic layer disposed on an upper surface of the first inorganic layer, the organic layer having a lower surface disposed above the first inorganic layer and an upper surface opposite to the lower surface, and a second inorganic layer disposed on the organic layer, the second inorganic layer having a higher refractive index than a refractive index of the organic layer, a capping layer disposed between the first inorganic layer and the organic light-emitting diode, the capping layer directly contacting an entirety of a lower surface of the second refractive-index control layer and an entirety of an upper surface of the second electrode, wherein the capping layer includes a high refractive-index material and a low refractive-index material, the first inorganic layer and the organic layer form an interface between the first inorganic layer and the organic layer, the first inorganic layer and the or organic layer have a refractive-index difference of about 0.15 or less, and the first inorganic layer and the second inorganic layer are comprised of a substantially same material as each other.

2. The display device of claim 1, wherein the first inorganic layer and the organic layer have a refractive-index difference of about 0.06 or less.

3. The display device of claim 1, wherein the thin film encapsulation layer has a thickness of about 50 μm or less.

4. The display device of claim 1, wherein the first inorganic layer has a thickness of from about 100 nm to about 1,000 nm.

5. The display device of claim 1, wherein the first inorganic layer includes silver, metal oxide, metal oxynitride, silicon oxide, silicon nitride, silicon oxynitride, or any combination thereof.

6. The display device of claim 1, wherein the first inorganic layer has a refractive index from about 1.6 to about 2.8.

7. The display device of claim 6, wherein the refractive index of the organic layer is in a range from about 1.4 to about 1.6.

8. The display device of claim 1, wherein the first inorganic layer has a refractive index from about 1.6 to about 1.75.

9. The display device of claim 1, wherein the first inorganic layer has a refractive index of about 1.75.

10. The display device of claim 1, wherein the refractive index of the organic layer is in a range from about 1.4 to 1.6.

11. The display device of claim 1, wherein the refractive index of the organic layer is about 1.5.

12. The display device of claim 1, wherein the second inorganic layer and the organic layer form an interface between the second inorganic layer and the organic layer, and wherein the second inorganic layer has a refractive index from about 1.6 to about 2.8.

13. The display device of claim 1, wherein the second inorganic layer comprises at least one compound selected from $Al_2O_3$, $TiO_2$, $ZrO$, $SiO_2$, AlON, AlN, SiON, $Si_3N_4$, ZnO, and $Ta_2O_5$.

14. The display device of claim 1, wherein the organic layer comprises at least one compound selected from: poly (3,4-ethylenedioxythiophene) (PEDOT), 4,4'-bis[N-(3-methylphenyl)-N-phenylamino]biphenyl (TPD), 4,4',4"-tris [(3-methylphenyl)phenylamino]triphenylamine (m-MTDATA), 1,3,5-tris [N,N-bis(2-methylphenyl)-amino] benzene (o-MTDAB), 1,3,5-tris[N,N-bis(3-methylphenyl)-amino]benzene (m-MTDAB), 1,3,5-tris [N,N-bis (4-methylphenyl)amino]benzene (p-MTDAB), 4,4'-bis[N,N-bis(3-methylphenyl)-amino]diphenylmethane (BPPM), 4,4-dicarbazolyl-1,1'-biphenyl (CBP), 4,4',4"-tris(N-carbazole) triphenylamine (TCTA), 2,2',2"-(1,3,5-benzenetolyl)tris-[1-phenyl-1H-benzoimidazol](TPBI), and 3-(4-biphenyl)-4-phenyl-5-t-butylphenyl-1,2,4-triazole (TAZ).

15. The display device of claim 1, wherein the capping layer overlaps an entire portion of the organic layer.

* * * * *